(12) United States Patent
Wen et al.

(10) Patent No.: US 10,811,106 B2
(45) Date of Patent: Oct. 20, 2020

(54) DATA READING METHOD, LOW VOLTAGE DETECTION LOGIC CIRCUIT, INTEGRATED CIRCUIT AND CHIP

(71) Applicant: Gree Electric Appliances, Inc. of Zhuhai, Guangdong (CN)

(72) Inventors: Langming Wen, Guangdong (CN); Heng Chen, Guangdong (CN); Dongbai Yi, Guangdong (CN); Li Fang, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 0 days.

(21) Appl. No.: 16/486,376

(22) PCT Filed: Oct. 18, 2017

(86) PCT No.: PCT/CN2017/106699
§ 371 (c)(1),
(2) Date: Aug. 15, 2019

(87) PCT Pub. No.: WO2018/166201
PCT Pub. Date: Sep. 20, 2018

(65) Prior Publication Data
US 2020/0234773 A1 Jul. 23, 2020

(30) Foreign Application Priority Data
Mar. 15, 2017 (CN) .......................... 2017 1 0154782

(51) Int. Cl.
*G11C 11/34* (2006.01)
*G11C 16/26* (2006.01)
*G11C 16/22* (2006.01)

(52) U.S. Cl.
CPC ............ *G11C 16/26* (2013.01); *G11C 16/225* (2013.01)

(58) Field of Classification Search
CPC ....... G11C 16/225; G11C 16/26; G11C 16/30; G11C 16/3404; G11C 2207/104;
(Continued)

(56) References Cited

U.S. PATENT DOCUMENTS

2004/0129954 A1* 7/2004 Hsu .......................... G11C 5/14
257/203
2016/0252938 A1 9/2016 Oishi

FOREIGN PATENT DOCUMENTS

| CN | 1554069 A | 12/2004 |
| CN | 101968840 A | 2/2011 |
| CN | 106683703 A | 5/2017 |

OTHER PUBLICATIONS

International Search Report, dated Jan. 16, 2016, in International application No. PCT/CN2017/106699, filed on Oct. 18, 2017.

* cited by examiner

*Primary Examiner* — Thong Q Le
(74) *Attorney, Agent, or Firm* — McAndrews, Held & Malloy, Ltd.

(57) ABSTRACT

A data reading method, a low voltage detection logic circuit, an integrated circuit and a chip are provided. The data reading method includes that: under the condition that a request for reading data from a NonVolatile Memory (NVM) is received, a pre-burnt region return value is read from a preset pre-burnt region of the NVM (S101); whether the pre-burnt region return value is equal to a target pre-burnt value or not is determined (S102); and under the condition that the pre-burnt region return value is equal to the target pre-burnt value, a first control signal is generated, and the first control signal is sent to an NVM controller and the first control signal is used for controlling the VNM controller to read the data from the NVM (S103).

18 Claims, 5 Drawing Sheets

(58) Field of Classification Search
CPC ............... G11C 2207/105; G11C 5/14; G11C 2029/2602; G11C 2029/5602; G11C 29/06; G11C 29/1201; G11C 29/48; G11C 29/56016; G11C 29/785; G11C 5/04; G11C 17/18; G11C 16/04; G11C 17/16; G11C 29/34; G11C 29/36; G11C 29/50
USPC ...... 365/189.11, 189.12, 201, 225.7, 185.12, 365/185.33, 189.03, 200, 218, 230.08, 96; 257/203, 209
See application file for complete search history.

DATA READING METHOD, LOW VOLTAGE DETECTION LOGIC CIRCUIT, INTEGRATED CIRCUIT AND CHIP

CROSS-REFERENCE TO RELATED APPLICATIONS

This application is a 371 of International Patent Application No. PCT/CN2017/106699, filed Oct. 18, 2017, which claims benefit of CN Application No. 201710154782.8, filed on Mar. 15, 2017, contents of both of which are hereby incorporated by reference in its their entirety.

TECHNICAL FIELD

The present disclosure relates to the technical field of integrated circuits, and in particular to a data reading method, a low voltage detection logic circuit, an integrated circuit and a chip.

BACKGROUND

A NonVolatile Memory (NVM) is a memory which is nonvolatile, accessible by byte, high in storage density, low in energy consumption and close to a Dynamic Random Access Memory (DRAM) in read and write performances, and the NVM is extensively applied to System on Chip (SoC) designs. The NVM may be configured to store system configuration information, data and executable codes, and plays an indispensable role in a system.

Stability of a power supply voltage of an NVM serving as a storage logic element may affect stability of data reading from the NVM. Particularly under the condition that the power supply voltage of the NVM is lower than a lowest threshold value stated in a specification of the NVM, read data may still be an initial value due to the insufficient power supply voltage of the NVM. For example, an initial value of a One-time Password (OTP) element is 0 and changes to 1 after being successfully burnt to the NVM, but data read from the NVM may change to 0 under the condition that the NVM works under a relatively low power supply voltage.

SUMMARY

The technical problem to be solved by at least some embodiments of the present disclosure is that stability of data reading from an NVM is relatively low due to a relatively low power supply voltage of the NVM.

In an embodiment of the present disclosure, a data reading method is provided, which includes that:

when a request for reading data for an NVM is received, a pre-burnt region return value is read from a preset pre-burnt region of the NVM, the pre-burnt region being a storage space sensitive to a low power supply voltage in the NVM and the pre-burnt region return value being a value read from the pre-burnt region; and when the pre-burnt region return value is equal to a target pre-burnt value, a first control signal is generated, and the first control signal is output to an NVM controller, the first control signal being used for controlling the NVM controller to read the data from the NVM, the target pre-burnt value being a value pre-burnt to the pre-burnt region.

In an optional embodiment, the method further includes that:

when the pre-burnt region return value is unequal to the target pre-burnt value, a second control signal is generated, and the second control signal is output to a chip protection component, the second control signal being used for controlling the chip protection component to trigger a chip to enter a self-protection mode.

In an optional embodiment, the method further includes that:

when the pre-burnt region return value is unequal to the target pre-burnt value, a third control signal is generated, and the third control signal is output to the NVM controller, the third control signal being used for prohibiting the NVM controller from reading the data from the NVM.

In an optional embodiment, the operation that the chip protection component is controlled to trigger the chip to enter the self-protection mode includes that:

the chip protection component is controlled to trigger an SoC to be reset; or, under the condition that the SoC is not triggered to be reset, the chip is controlled to enter a security mode to ensure that error information of a low voltage of the NVM may be detected by an outside device.

In another embodiment of the present disclosure, a low voltage detection logic circuit is provided. The low voltage detection logic circuit is respectively connected with an NVM, an NVM controller and a chip protection component, and the low voltage detection logic circuit includes:

a reading element, configured to, when a request for reading data from the NVM is received, read a pre-burnt region return value from a preset pre-burnt region of the NVM, the pre-burnt region being a storage space sensitive to a low power supply voltage in the NVM and the pre-burnt region return value being a value read from the pre-burnt region; and a first control element, configured to, when the pre-burnt region return value is equal to a target pre-burnt value, generate a first control signal and output the first control signal to the NVM controller, the first control signal being used for controlling the NVM controller to read the data from the NVM, the target pre-burnt value being a value pre-burnt to the pre-burnt region.

In an optional embodiment, the low voltage detection logic circuit further includes:

a second control element, configured to, when the pre-burnt region return value is unequal to the target pre-burnt value, generate a second control signal and output the second control signal to the chip protection component, the second control signal being used for controlling the chip protection component to trigger a chip to enter a self-protection mode.

In an optional embodiment, the low voltage detection logic circuit further includes:

a third control element, configured to, when the pre-burnt region return value is unequal to the target pre-burnt value, generate a third control signal and output the third control signal to the NVM controller, the third control signal being used for prohibiting the NVM controller from reading the data from the NVM.

In an optional embodiment, the pre-burnt region is a storage space of which an offset relative to a power supply of the NVM exceeds a first offset.

In an optional embodiment, the target pre-burnt value stored in the pre-burnt region is an inverse value of an initial value.

In an optional embodiment, there is at least one pre-burnt region.

In another embodiment of the present disclosure, an integrated circuit is provided, which includes an NVM controller and the abovementioned low voltage detection logic circuit, and a first input end of the NVM controller is connected with a first signal control end of the low voltage detection logic circuit, a second input end of the NVM controller is connected with an NVM, and the NVM controller is configured to, when the low voltage detection logic circuit determines that a pre-burnt region return value read from a preset pre-burnt region of the NVM is equal to a target pre-burnt value, read data from the NVM according to a first control signal generated by the low voltage detection logic circuit and, when the low voltage detection logic circuit determines that the pre-burnt region return value is unequal to the target pre-burnt value, receive a third control signal generated by the low voltage detection logic circuit, the third control signal being used for prohibiting the NVM controller from reading the data from the NVM, the target pre-burnt value being a value pre-burnt to the pre-burnt region and the pre-burnt region being a storage space sensitive to a low power supply voltage in the NVM.

In an optional embodiment, the integrated circuit further includes a chip protection component; and an input end of the chip protection component is connected with a second signal control end of the low voltage detection logic circuit, and the chip protection component is configured to, when the low voltage detection logic circuit determines that the pre-burnt region return value is unequal to the target pre-burnt value, trigger a chip to enter a self-protection mode according to a second control signal generated by the low voltage detection logic circuit.

In another embodiment of the present disclosure, a chip is provided, which includes the abovementioned integrated circuit.

In another embodiment of the present disclosure, a chip is provided, which includes the abovementioned integrated circuit and an NVM connected with the integrated circuit, and the NVM is preset with a pre-burnt region sensitive to a low power supply voltage, and a target pre-burnt value is pre-burnt in the pre-burnt region.

From the technical solutions, it can be seen that the embodiments of the present disclosure disclose the data reading method, the integrated circuit and the chip, the integrated circuit includes the low voltage detection logic circuit and the NVM controller, the low voltage detection logic circuit, before the NVM controller reads the data from the NVM, may read the pre-burnt region return value from the pre-burnt region of the NVM at first and perform comparison to determine whether the pre-burnt region return value is equal to the target pre-burnt value pre-burnt to the pre-burnt region or not to determine whether a power supply voltage of the NVM is normal or not, and when the pre-burnt region return value is equal to the target pre-burnt value, namely the power supply voltage of the NVM is normal, the NVM controller may read the data from the NVM. Thus it can be seen that, in the present disclosure, the data in the NVM is read when the power supply voltage of the NVM is normal, which can effectively ensure stability of data reading from the NVM and solve the problem of data reading instability caused by an abnormal state of the power supply voltage of the NVM.

Detailed descriptions about exemplary embodiments of the present disclosure will be made below with reference to the drawings to make the other characteristics and advantages of the present disclosure clearer.

BRIEF DESCRIPTION OF THE DRAWINGS

In order to describe the technical solutions in the embodiments of the present disclosure or a conventional art more clearly, the drawings required to be used for describing the embodiments or the conventional art will be simply introduced below. It is apparent that the drawings described below are embodiments of the present disclosure. Those of ordinary skill in the art may further obtain other drawings according to the drawings of the present disclosure without creative work.

DETAILED DESCRIPTION

The technical solutions in the embodiments of the present disclosure will be described clearly and completely below in combination with the drawings in the embodiments of the present disclosure. It is apparent that the described embodiments are not all the embodiments but only part of embodiments of the present disclosure. All other embodiments obtained by those of ordinary skill in the art based on the embodiments in the present disclosure without creative work shall fall within the scope of protection of the present disclosure.

At least some embodiments of the present disclosure disclose a data reading method, a low voltage detection logic circuit, an integrated circuit and a chip, to achieve stability of data reading from an NVM and solve the problem of data reading instability caused by an abnormal power supply voltage of the NVM as much as possible.

Figure 1:
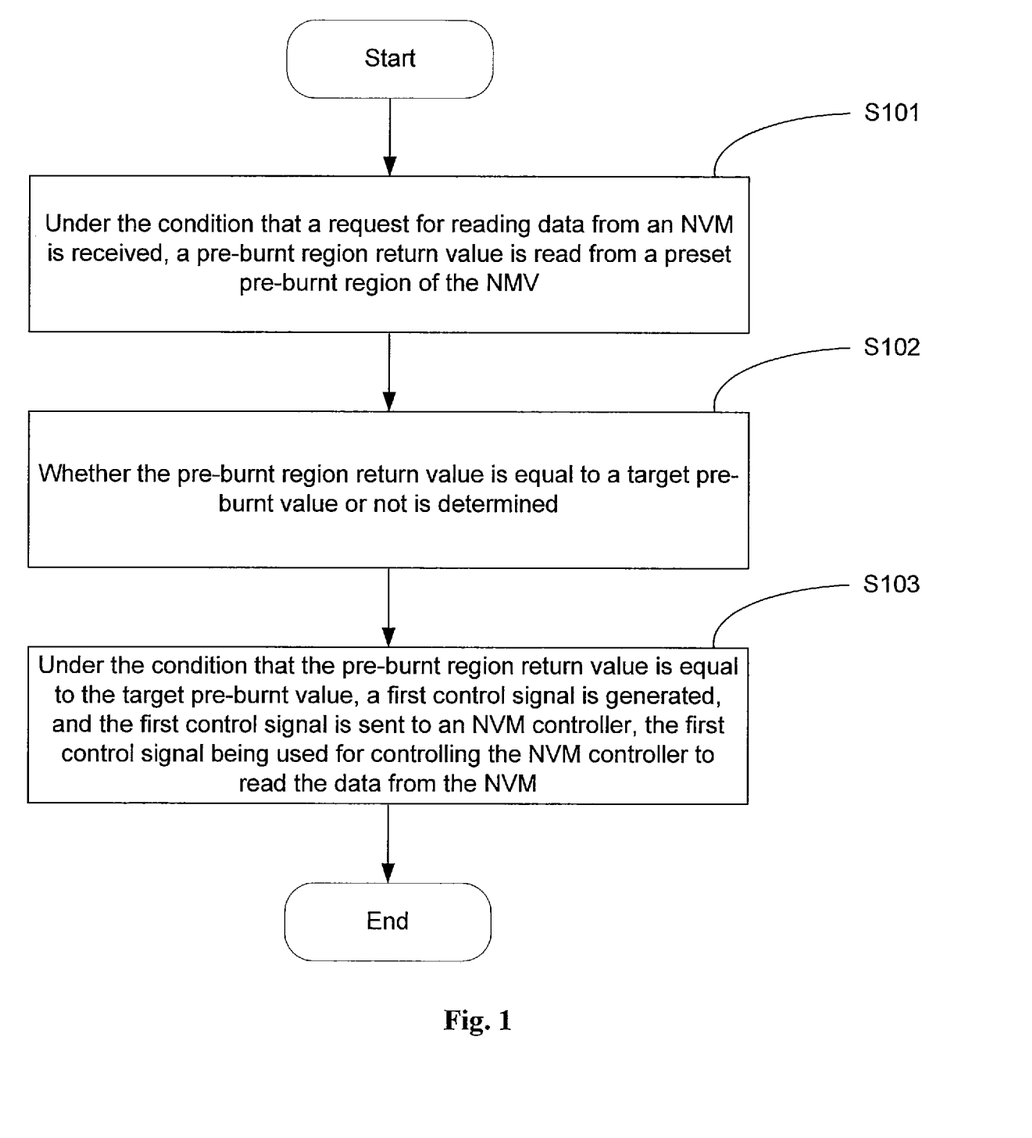
FIG. 1 is a flowchart of a data reading method according to an embodiment of the present disclosure.

FIG. 1 is a flowchart of a data reading method according to an embodiment of the present disclosure. The data reading method may be applied to a low voltage detection logic circuit.

At step S101, under the condition that a request for reading data from an NVM is received, a pre-burnt region return value is read from a preset pre-burnt region of the NVM, the pre-burnt region being a storage space sensitive to a low power supply voltage in the NVM, the low power supply voltage being a voltage lower than a power supply voltage threshold value (for example, a lowest voltage threshold value), and the pre-burnt region return value is a value read from the pre-burnt region.

Figure 2:
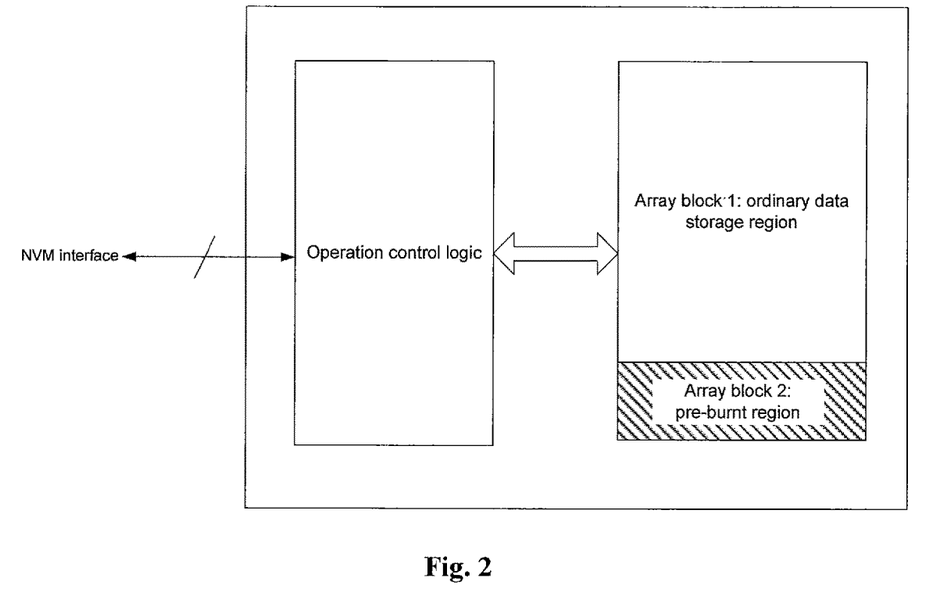
FIG. 2 is a schematic diagram of defining a pre-burnt region in an NVM according to an optional embodiment of the present disclosure.

The NVM is a memory. This memory is nonvolatile, accessible by byte, high in storage density, low in energy consumption and this memory is close to a DRAM in read and write performances. In the embodiment, the storage space most sensitive to the low power supply voltage in storage elements of the NVM is determined as the pre-burnt region. According to a storage characteristic of the NVM, sensitivities of different address spaces in the storage elements of the NVM to the power supply voltage are different somehow. The inventor of the present disclosure finds by researches that, compared with the storage element relatively close to a power supply of the NVM, the storage element relatively far away from the power supply of the NVM is higher in data reading error rate under a low-voltage power supply condition. Therefore, during a practical application, the storage space of which an offset relative to the power supply of the NVM exceeds a first offset may be determined as the pre-burnt region. For example, as shown in FIG. 2, the array block 2 shown as a slashed part is the pre-burnt region, while the array block 1 shown as a blank region denotes an ordinary data storage region configured for data storage. When the data in the NVM is to be operated, the data may be processed through an NVM interface and operation control logic.

It is to be noted that the number of the pre-burnt region is not limited to one. Under the condition of not affecting performance of the NVM, multiple low-voltage-sensitive regions in the NVM may be selected as pre-burnt regions. Each pre-burnt region is a storage space of which an offset relative to the power supply of the NVM exceeds the first offset. A numerical value of the first offset may specifically be determined according to a practical requirement.

During the practical application, the pre-burnt region of the NVM may also be determined by research personnel of the NVM.

For convenient understanding, the embodiments of the present disclosure also disclose some application scenarios that the low voltage detection logic circuit (which will be described hereinafter in detail) receives the request for reading the data from the NVM, i.e., application scenarios that the low voltage detection logic circuit is triggered to detect the power supply voltage of the NVM. For example, the following conditions may be included.

At one, in a chip starting process, under the condition that a circuit system in a chip may read system configuration information from the NVM to complete system configuration, the low voltage detection logic circuit may be triggered to detect the power supply voltage of the NVM.

At two, after the chip is started, when the circuit system may trigger an NVM controller to read sensitive information from the NVM according to an application requirement, the low voltage detection logic circuit may be triggered to detect the power supply voltage of the NVM.

At two, when the chip includes an encryption and decryption component and all keys are stored in the NVM, under the condition that a key may be read from the NVM, the low voltage detection logic circuit may be triggered to detect the power supply voltage of the NVM.

At step S102, whether the pre-burnt region return value is equal to a target pre-burnt value or not is determined.

In the embodiment, the target pre-burnt value is a value pre-burnt to the pre-burnt region of the NVM, and the pre-burnt region return value is a value read from the pre-burnt region of the NVM. Under the condition that the power supply voltage of the NVM is normal, the NVM is in a stable state, and under this condition, the pre-burnt region return value read from the pre-burnt region of the NVM is equal to the target pre-burnt value pre-burnt to the pre-burnt region. On the contrary, under the condition that the power supply voltage of the NVM is an abnormal power supply voltage (for example, the power supply voltage of the NVM is lower than the power supply voltage threshold value (for example, the lowest voltage threshold value)), the NVM is in an instable state. And under this condition, the pre-burnt region return value read from the pre-burnt region of the NVM is unequal to the target pre-burnt value pre-burnt to the pre-burnt region.

In some embodiments, a setting basis for the target pre-burnt value may be as follows. The target pre-burnt value may be selected based on a structural characteristic of the storage element in the NVM. And when the structural characteristic of the storage element determines that either high or low stored value may be wrongly considered as an initial value in case of the low power supply voltage of the NVM, the target pre-burnt value may adopt an inverse value of the initial value. For example, when a default initial value is 1'b0, the target pre-burnt value may be set to be 1'b1; or, when the default initial value is 1'b1, the target pre-burnt value may be set to be 1'b0. Therefore, when the low power supply voltage is provided for the NVM, the read-out pre-burnt region return value changes to the initial value, namely the pre-burnt region return value is unequal to the target pre-burnt value.

At step S103, under the condition that the pre-burnt region return value is equal to the target pre-burnt value, a first control signal is generated, and the first control signal is sent to an NVM controller. The first control signal is used for controlling the NVM controller to read the data from the NVM. For example, once the pre-burnt region return value has a bit error relative to the target pre-burnt value, it is determined that the pre-burnt region return value is unequal to the target pre-burnt value.

The total byte number of the target pre-burnt value may include, but not limited to, 4*N (N≥1). Any number of 1~4*N (N≥1) may be selected on the premise of meeting system performance.

In the data reading method of the abovementioned embodiments, before the NVM controller reads the data from the NVM, the pre-burnt region return value may be read from the pre-burnt region of the NVM at first. Comparison is performed to determine whether the pre-burnt region return value is equal to the target pre-burnt value pre-burnt to the pre-burnt region or not to determine whether the power supply voltage of the NVM is normal or not. And when the pre-burnt region return value is equal to the target pre-burnt value, namely under the condition that the power supply voltage of the NVM is normal, the NVM controller reads the data from the NVM. Thus it can be seen that, according to the embodiments of the present disclosure, the data in the NVM is read when it is determined that the power supply voltage, of the NVM is normal, which can effectively ensure stability of data reading from the NVM and solve the problem of data reading instability caused by an abnormal state of the power supply voltage (for example, low power supply voltage) of the NVM as much as possible.

For protecting the NVM in the instable state against attacks of a hacker and avoiding the hacker attacking the chip bypassing system control, under the condition that the low voltage detection logic circuit determines that the read pre-burnt region return value is unequal to the target pre-burnt value, the low voltage detection logic circuit may control a chip protection component to trigger the chip to enter a self-protection mode.

Figure 3:
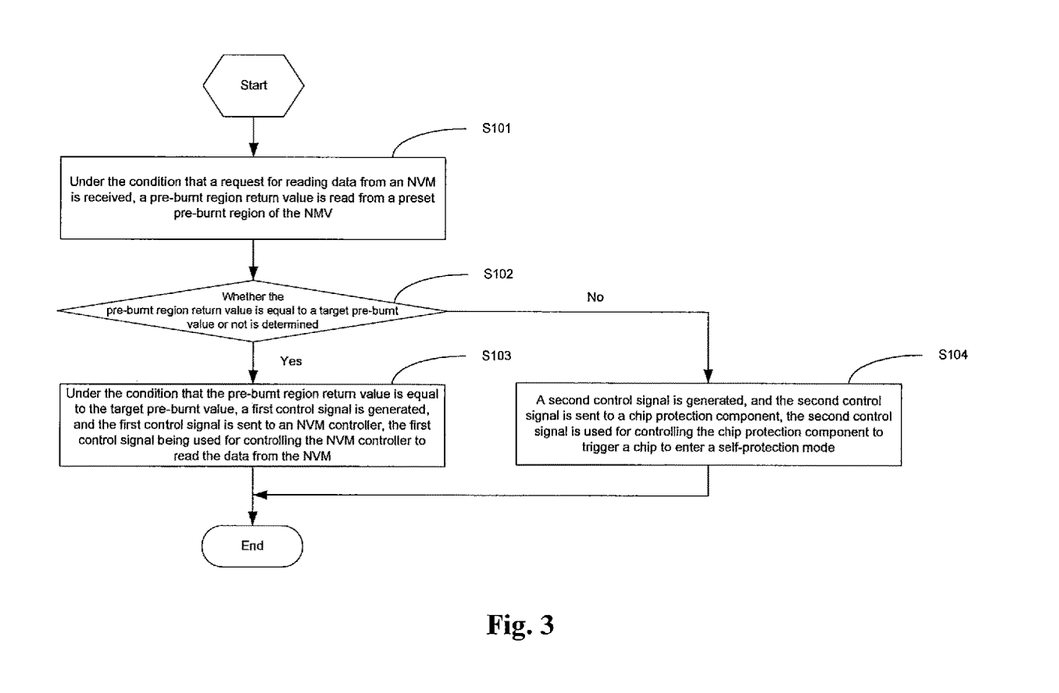
FIG. 3 is a flowchart of a data reading method according to another embodiment of the present disclosure.

FIG. 3 is a flowchart of a data reading method according to another embodiment of the present disclosure. Based on the embodiment shown in FIG. 1, the embodiment shown in FIG. 3 may further include step S104.

At step S104, under the condition that the pre-burnt region return value is unequal to the target pre-burnt value, a second control signal is generated, and the second control signal is sent to a chip protection component, the second control signal being used for controlling the chip protection component to trigger a chip to enter a self-protection mode. Here, the chip includes a dedicated self-protection component capable of enabling the chip to make data of a debugging component and a sensitive region inaccessible, namely entering the self-protection mode. The dedicated self-protection component of the chip may be understood by those skilled in the art and thus will not be described herein.

In the abovementioned embodiments, after the chip protection component triggers the chip to enter the self-protection mode, the chip may protect the NVM in the instable state against the attacks of the hacker, and the self-protection mode of the chip may be implemented under the condition that an SoC is triggered to be reset or the SoC is not triggered to be reset.

In some embodiments, the process at step S104 that the chip protection component is controlled to trigger the chip to enter the self-protection mode may include that: the chip protection component is controlled to trigger an SoC to be reset; or, under the condition that the SoC is not triggered to be reset, the chip is controlled to enter a security mode (for example, the dedicated self-protection component of the chip enters the security mode) to ensure as much as possible that an external device may detect error information of the low voltage of the NVM. Here, the external device refers to a special function component or debugging tool added outside the chip and the external device is arranged to attack the chip.

For protecting the NVM in the instable state against the attacks of the hacker and avoiding the hacker attacking the chip bypassing system control, under the condition that the low voltage detection logic circuit determines that the read pre-burnt region return value is unequal to the target pre-burnt value, the NVM controller may also be controlled to prohibit an operation of reading the data from the NVM.

Figure 4:
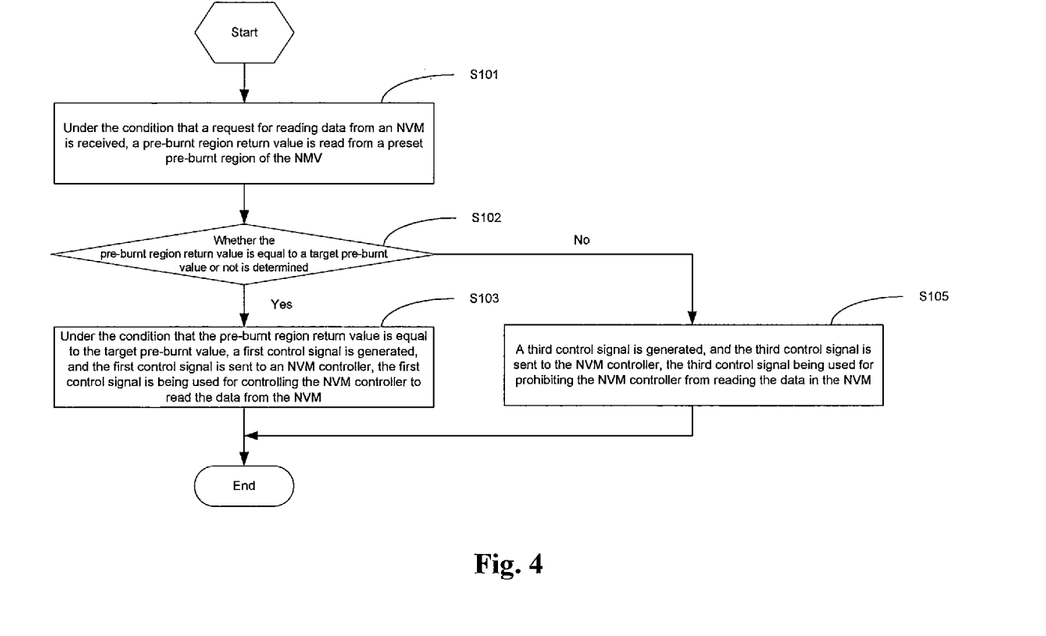
FIG. 4 is a flowchart of a data reading method according to another embodiment of the present disclosure.

FIG. 4 is a flowchart of a data reading method according to another embodiment of the present disclosure. Based on the embodiment shown in FIG. 1, the embodiment shown in FIG. 4 may further include step S105.

At step S105, under the condition that the pre-burnt region return value is unequal to the target pre-burnt value, a third control signal is generated, and the third control signal is sent to the NVM controller, the third control signal being used for prohibiting the NVM controller from reading the data in the NVM. Herein, the third control signal is configured to prohibit the NVM controller from reading the data from the NVM.

In the data reading method of the embodiment of the present disclosure, the low voltage detection logic circuit, before the NVM controller reads sensitive data from the NVM, may read the pre-burnt region return value from the pre-burnt region of the NVM at first and perform comparison to determine whether the pre-burnt region return value is equal to the target pre-burnt value pre-burnt to the pre-burnt region or not to determine whether the power supply voltage of the NVM is normal or not. Under the condition that the pre-burnt region return value is equal to the target pre-burnt value, namely under the condition that the power supply voltage of the NVM is normal, the NVM controller reads the sensitive data from the NVM. On the contrary, under the condition that the pre-burnt region return value is unequal to the target pre-burnt value, the NVM controller is prohibited from reading the sensitive data in the NVM. In such a manner, the NVM in the instable state may be protected against the attacks of the hacker and the hacker may be avoided to attack the chip bypassing system control. Therefore, according to the embodiments of the present disclosure, the sensitive data in the NVM is read when it is determined that the power supply voltage of the NVM is normal, which can effectively ensure the stability of data reading from the NVM as much as possible and solve the problem of data reading instability caused by the abnormal state of the power supply voltage (for example, low power supply voltage) of the NVM.

In some practical applications, for protecting the NVM in the instable state against the attacks of the hacker and avoiding the hacker attacking the chip bypassing system control, under the condition that the low voltage detection logic circuit determines that the read pre-burnt region return value is unequal to the target pre-burnt value, not only may the chip protection component be controlled to trigger the chip to enter the self-protection mode, but also the NVM controller may be prohibited from executing the operation of reading the data from the NVM.

Figure 5:
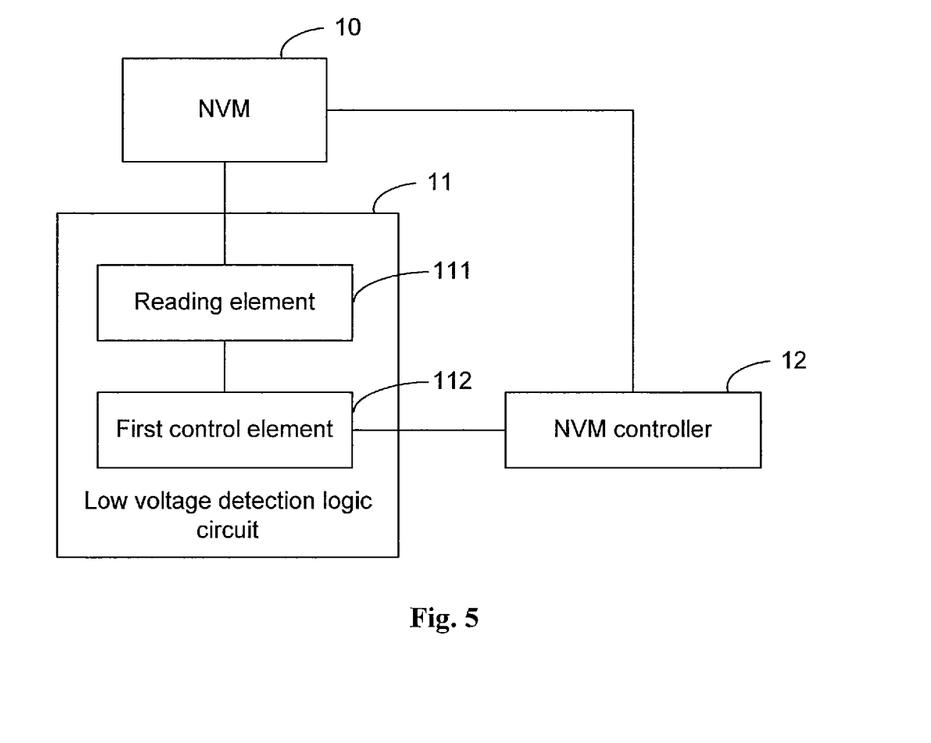
FIG. 5 is a structural schematic diagram of a low voltage detection logic circuit according to an embodiment of the present disclosure.

Corresponding to the method embodiments, another embodiment of the present disclosure also provides a low voltage detection logic circuit. FIG. 5 is a structural schematic diagram of a low voltage detection logic circuit according to an embodiment of the present disclosure. As shown in FIG. 5, the low voltage detection logic circuit 11 is connected with an NVM 10 and an NVM controller 12 respectively, and the low voltage detection logic circuit 11 may include a reading element 111 and a first control element 112.

The reading element 111 is configured to, under the condition that a request for reading data from the NVM is received, read a pre-burnt region return value from a preset pre-burnt region of the NVM 10, the pre-burnt region being a storage space sensitive to a low power supply voltage in the NVM 10 and the low power supply voltage being a voltage lower than a power supply voltage threshold value (for example, a lowest voltage threshold value).

According to a storage characteristic of the NVM, sensitivities of different address spaces in storage elements of the NVM to the power supply voltage are different somehow. The inventor of the present disclosure finds by researches that, compared with the storage element relatively close to a power supply of the NVM, the storage element relatively far away from the power supply of the NVM is higher in data reading error rate under a low-voltage power supply condition. Therefore, during a practical application, the storage space of which an offset relative to the power supply of the NVM exceeds a first offset may be determined as the pre-burnt region.

It is to be noted that the number of the pre-burnt region is not limited to one. Under the condition of not affecting performance of the NVM, multiple low-voltage-sensitive regions in the NVM may be selected as pre-burnt regions. Each pre-burnt region is a storage space of which an offset relative to the power supply of the NVM exceeds the first offset. A numerical value of the first offset may specifically be determined according to a practical requirement.

During the practical application, the pre-burnt region of the NVM may also be determined by research personnel of the NVM.

The first control element 112 is configured to, under the condition that the pre-burnt region return value is equal to a target pre-burnt value, generate a first control signal and send the first control signal to the NVM controller 12, the first control signal being used for controlling the NVM controller 12 to read the data from the NVM 10. The NVM controller 12 may be a component located in a chip and configured to read the data from the NVM 10.

In some embodiments, a setting basis for the target pre-burnt value may be as follows. The target pre-burnt value may be selected based on a structural characteristic of the storage element in the NVM. And when the structural characteristic of the storage element determines that either high or low stored value may be wrongly considered as an initial value in case of the low power supply voltage of the NVM, the target pre-burnt value may adopt an inverse value of the initial value. For example, when a default initial value is 1'b0, the target pre-burnt value may be set to be 1'b1; or, when the default initial value is 1'b1, the target pre-burnt value may be set to be 1'b0.

In the abovementioned embodiments of the present disclosure, the reading element of the low voltage detection logic circuit, before the NVM controller reads the data from the NVM, may read the pre-burnt region return value from the pre-burnt region of the NVM at first. The low voltage detection logic circuit performs comparison to determine whether the pre-burnt region return value is equal to the target pre-burnt value pre-burnt to the pre-burnt region or not to determine whether a power supply voltage of the NVM is normal or not. And under the condition that the pre-burnt region return value is equal to the target pre-burnt value, namely under the condition that the power supply voltage of the NVM is normal, the first control element of the low voltage detection logic circuit controls the NVM controller to read the data from the NVM. Therefore, according to the embodiments of the present disclosure, the data in the NVM is read when it is determined that the power supply voltage of the NVM is normal, which can effectively ensure stability of data reading from the NVM and solve the problem of data reading instability caused by an abnormal state of the power supply voltage (for example, low power supply voltage) of the NVM as much as possible.

Figure 6:
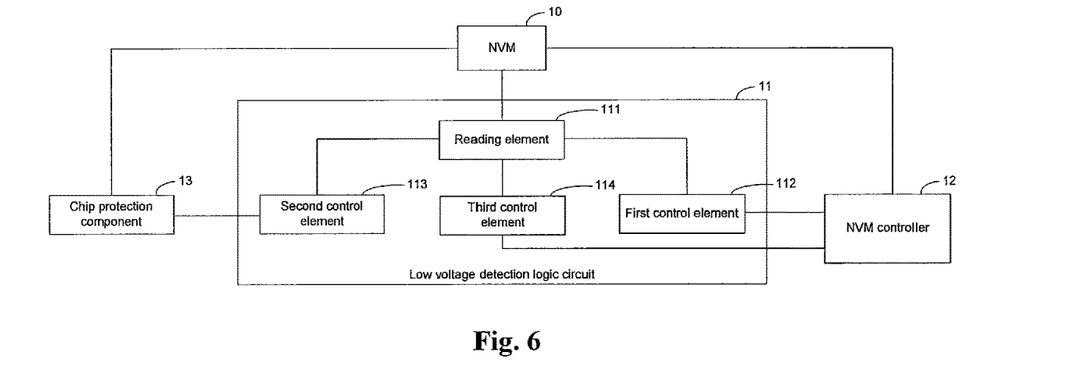
FIG. 6 is a structural schematic diagram of a low voltage detection logic circuit according to another embodiment of the present disclosure.

FIG. 6 is a structural schematic diagram of a low voltage detection logic circuit according to another embodiment of the present disclosure.

In some embodiments, based on the embodiment shown in FIG. 5, the low voltage detection logic circuit shown in FIG. 6 may further include a second control element 113. The second control element 113 may be configured to, under the condition that the pre-burnt region return value is unequal to the target pre-burnt value, generate a second control signal and send the second control signal to a chip protection component 13 to control the chip protection component 13 to trigger a chip to enter a self-protection mode.

From the above discussions, it can be seen that, after the chip protection component 13 triggers the chip to enter the self-protection mode, the chip may protect the NVM in an instable state against attacks of a hacker, and the self-protection mode of the chip may be implemented under the condition that an SoC is triggered to be reset or the SoC is not triggered to be reset. In some embodiments, the process that the second control element 113 controls the chip protection component 13 to trigger the chip to enter the self-protection mode may include that: the chip protection component 13 is controlled to trigger an SoC to be reset; or, under the condition that the SoC is not triggered to be reset, the chip is controlled to enter a security mode to ensure as much as possible that an external device may detect error information of the low voltage of the NVM.

For protecting the NVM in the instable state against the attacks of the hacker and avoiding the hacker attacking the chip bypassing system control, under the condition that the low voltage detection logic circuit 11 determines that the read pre-burnt region return value is unequal to the target pre-burnt value, the NVM controller 12 may also be controlled to prohibit an operation of reading the data from the NVM 10.

In some embodiments, as shown in FIG. 6, the low voltage detection logic circuit 11 may further include a third control element 114. The third control element 114 may be configured to, under the condition that the pre-burnt region return value is unequal to the target pre-burnt value, generate a third control signal and send the third control signal to the NVM controller 12 to prohibit the NVM controller 12 from reading the data from the NVM 10. Herein, the third control signal is configured to prohibit the NVM controller 12 from reading the data from the NVM 10.

In some practical applications, for protecting the NVM in the instable state against the attacks of the hacker and avoiding the hacker attacking the chip bypassing system control, under the condition that the low voltage detection logic circuit determines that the read pre-burnt region return value is unequal to the target pre-burnt value, the chip protection component may be controlled by use of the second control element 113 to trigger the chip to enter the self-protection mode, and the NVM controller 12 may also be prohibited by use of the third control element 114 from reading the data from the NVM 10.

In the abovementioned embodiments of the present disclosure, the reading element of the low voltage detection logic circuit, before the NVM controller reads the data from the NVM, may read the pre-burnt region return value from the pre-burnt region of the NVM. The low voltage detection logic circuit performs comparison to determine whether the pre-burnt region return value is equal to the target pre-burnt value pre-burnt to the pre-burnt region or not to determine whether the power supply voltage of the NVM is normal or not. Under the condition that the pre-burnt region return value is equal to the target pre-burnt value, namely under the condition that the power supply voltage of the NVM is normal, the first control element of the low voltage detection logic circuit controls the NVM controller to read the data from the NVM. On the contrary, under the condition that the pre-burnt region return value is unequal to the target pre-burnt value, the second control element of the low voltage detection logic circuit controls the chip protection component to trigger the chip to enter the self-protection mode, and the third control element of the low voltage detection logic circuit prohibits the NVM controller from reading the data from the NVM. In such a manner, the NVM in the instable state may be protected against the attacks of the hacker and the hacker may be avoided to attack the chip bypassing system control. Therefore, according to the embodiments of the present disclosure, the data in the NVM is read when it is determined that the power supply voltage of the NVM is normal, which can effectively ensure the stability of data reading from the NVM as much as possible and solve the problem of data reading instability caused by the abnormal state of the power supply voltage of the NVM as much as possible.

For convenient understanding, the embodiments of the present disclosure also disclose some application scenarios that the low voltage detection logic circuit 11 receives the request for reading the data from the NVM 10, i.e., application scenarios that the low voltage detection logic circuit 11 is triggered to detect the power supply voltage of the NVM 10. For example, the following conditions may be included.

At one, in a chip starting process, under the condition that a circuit system in the chip may read system configuration information from the NVM 10 to complete system configuration, the low voltage detection logic circuit 11 may be triggered to detect the power supply voltage of the NVM.

At two, after the chip is started, when the circuit system may trigger the NVM controller 12 to read sensitive information from the NVM 10 according to an application requirement, the low voltage detection logic circuit 11 may be triggered to detect the power supply voltage of the NVM 10.

At three, when the chip includes an encryption and decryption component and all keys are stored in the NVM 10, under the condition that a key may be read from the NVM 10, the low voltage detection logic circuit 11 may be triggered to detect the power supply voltage of the NVM 10.

After the low voltage detection logic circuit is triggered under the three conditions, the circuit system enters a ready state for reading the system configuration information, the key or other sensitive information from the NVM at first. Then, the low voltage detection logic circuit reads the pre-burnt region return value from the pre-burnt region and determines whether the pre-burnt region return value is equal to the target pre-burnt value or not. When the pre-burnt region return value is equal to the target pre-burnt value, the first control signal is generated, and the first control signal is sent to the NVM controller to control the NVM controller to read the system configuration information, the key or the other sensitive information from the NVM. When the pre-burnt region return value is unequal to the target pre-burnt value, the second control signal and the third control signal are generated, the second control signal is sent to the chip protection component to control the chip protection component to trigger the chip to enter the self-protection mode, and the third control signal is sent to the NVM controller to prohibit the NVM controller from reading the system configuration information, key or other sensitive information from the NVM.

Figure 7:
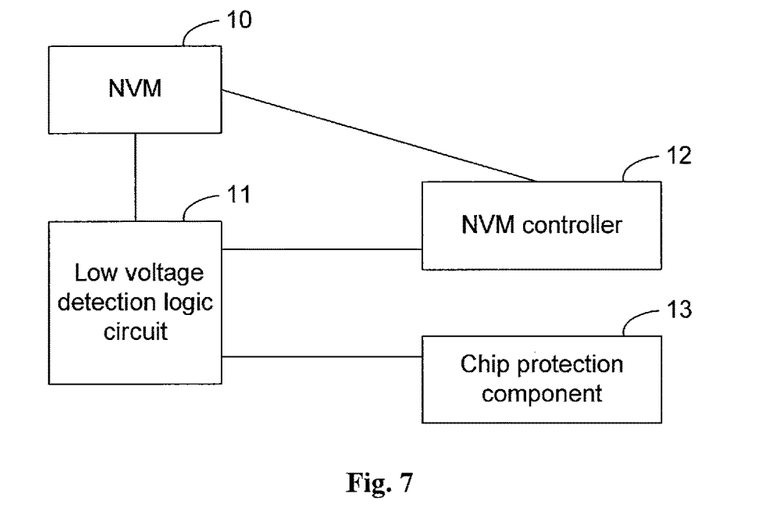
FIG. 7 is a circuit diagram of an integrated circuit according to an embodiment of the present disclosure.

FIG. 7 is a circuit diagram of an integrated circuit according to an embodiment of the present disclosure. As shown in FIG. 7, the integrated circuit may include the abovementioned low voltage detection logic circuit 11 and an NVM controller 12 connected with the low voltage detection logic circuit 11. For example, a first input end of the NVM controller 12 is connected with a first signal control end of the low voltage detection logic circuit 11, and a second input end of the NVM controller 12 is connected with an NVM 10.

In some embodiments, the low voltage detection logic circuit 11 may be configured to, under the condition that a request for reading data from the NVM 10 is received, read a pre-burnt region return value from a preset pre-burnt region of the NV and, under the condition that the pre-burnt region return value is equal to a target pre-burnt value, generate a first control signal and send the first control signal to the NVM controller, the pre-burnt region being a storage space sensitive to a low power supply voltage in the NVM, the low power supply voltage being a voltage lower than a power supply voltage threshold value (for example, a lowest voltage threshold value) and the target pre-burnt value being a value pre-burnt to the pre-burnt region.

In some embodiments, the NVM controller 12 may be configured to, under the condition that the first control signal is received from the low voltage detection logic circuit 11, read the data from the NVM 10. For example, the NVM controller 12 may be configured to, under the condition that the low voltage detection logic circuit 11 determines that the pre-burnt region return value read from the preset pre-burnt region of the NVM 10 is equal to the target pre-burnt value, read the data from the NVM 10 according to the first control signal generated by the low voltage detection logic circuit 11.

In some embodiments, the low voltage detection logic circuit 11 may further be configured to, under the condition that the pre-burnt region return value is unequal to the target pre-burnt value, generate a third control signal and send the third control signal to the NVM controller 12.

In some embodiments, the NVM controller 12 may further be configured to, under the condition that the third control signal is received from the low voltage detection logic circuit 11, be prohibited from reading the data from the NVM 10. For example, the NVM controller 12 may further be configured to, under the condition that the low voltage detection logic circuit 11 determines that the pre-burnt region return value is unequal to the target pre-burnt value, receive the third control signal generated by the low voltage detection logic circuit 11, the third control signal being configured to prohibit the NVM controller 12 from reading the data from the NVM 10.

It is to be noted that a specific working principle of the low voltage detection logic circuit 11 may also refer to the abovementioned embodiments.

For protecting the NVM in an instable state against attacks of a hacker and avoiding the hacker attacking a chip bypassing system control, under the condition that the low voltage detection logic circuit 11 determines that the read pre-burnt region return value is unequal to the target pre-burnt value, a chip protection component may also be controlled to trigger the chip to enter a self-protection mode.

In some embodiments, as shown in FIG. 7, the integrated circuit may further include a chip protection component 13 connected with the low voltage detection logic circuit 11. For example, an input end of the chip protection component 13 is connected with a second signal control end of the low voltage detection logic circuit 11.

In some embodiments, the low voltage detection logic circuit 11 may further be configured to, under the condition that the pre-burnt region return value is unequal to the target pre-burnt value, generate a second control signal and send the second control signal to the chip protection component 13. The chip protection component 13 may be configured to, under the condition that the second control signal is received from the low voltage detection logic circuit 11, trigger a chip to enter a self-protection mode. For example, the chip protection component 13 may be configured to, under the condition that the low voltage detection logic circuit 11 determines that the pre-burnt region return value is unequal to the target pre-burnt value, trigger the chip to enter the self-protection mode according to the second control signal generated by the low voltage detection logic circuit 11.

From the above discussions, it can be seen that, after the chip protection component 13 triggers the chip to enter the self-protection mode, the chip may protect the NVM in the instable state against the attacks of the hacker, and the self-protection mode of the chip may be implemented under the condition that an SoC is triggered to be reset or the SoC is not triggered to be reset. In some embodiments, the process that the low voltage detection logic circuit 11 controls the chip protection component 13 to trigger the chip to enter the self-protection mode may include that: the chip protection component 13 is controlled to trigger an SoC to be reset; or, under the condition that the SoC is not triggered to be reset, the chip is controlled to enter a security mode to ensure as much as possible that an external device may detect error information of the low voltage of the NVM.

In some practical applications, for protecting the NVM in the instable state against the attacks of the hacker and avoiding the hacker attacking the chip bypassing system control, under the condition that the low voltage detection logic circuit determines that the read pre-burnt region return value is unequal to the target pre-burnt value, the chip protection component may be controlled to trigger the chip to enter the self-protection mode, and the NVM controller may be controlled to be prohibited from reading the data from the NVM.

In the abovementioned embodiments of the present disclosure, the low voltage detection logic circuit, before the NVM controller reads the data from the NVM, may read the pre-burnt region return value from the pre-burnt region of the NVM. The low voltage detection logic circuit performs comparison to determine whether the pre-burnt region return value is equal to the target pre-burnt value pre-burnt to the pre-burnt region or not to determine whether the power supply voltage of the NVM is normal or not. Under the condition that the pre-burnt region return value is equal to the target pre-burnt value, namely under the condition that the power supply voltage of the NVM is normal, the low voltage detection logic circuit controls the NVM controller to read the data from the NVM. On the contrary, under the condition that the pre-burnt region return value is unequal to the target pre-burnt value, the low voltage detection logic circuit controls the chip protection component to trigger the chip to enter the self-protection mode and controls the NVM controller to prohibit the data in the NVM from being read. In such a manner, the NVM in the instable state may be protected against the attacks of the hacker and the hacker may be avoided to attack the chip bypassing system control. Therefore, according to the embodiments of the present disclosure, the data in the NVM is read when it is determined that the power supply voltage of the NVM is normal, which can effectively ensure stability of data reading from the NVM as much as possible and solve the problem of data reading instability caused by an abnormal state of the power supply voltage of the NVM as much as possible.

Those skilled in the art should know that a chip consists of an integrated circuit and the VNM 10 may be located outside the chip and may also be located inside the chip. Therefore, based on the abovementioned embodiments, another embodiment of the present disclosure also provides two chips. The first chip is integrated with the integrated circuit in the abovementioned embodiments but not integrated with the VNM 10. The second chip is integrated with both the integrated circuit in the abovementioned embodiments and the NVM 10. The VNM 10 is connected with the integrated circuit, the NVM 10 is preset with a pre-burnt region sensitive to a low power supply voltage, and a target pre-burnt value is pre-burnt in the pre-burnt region.

Another embodiment of the present disclosure may also provide a chip, which includes the integrated circuit in the abovementioned embodiments. Furthermore, the chip may further include an NVM 10 connected with the integrated circuit. The VNM 10 is preset with a pre-burnt region sensitive to a low power supply voltage, and a target pre-burnt value is pre-burnt in the pre-burnt region.

In the embodiments of the present disclosure, in a mass production stage and testing stage of the chip, after the target pre-burnt value is successfully burnt to the pre-burnt region of the NVM 10 through a dedicated test port of the NVM, write protection may be performed on the pre-burnt region to avoid the target pre-burnt value of the pre-burnt region being rewritten due to wrong burning of a Central Processing Unit (CPU) in a normal function mode of the NVM 10.

For convenient understanding, the embodiments of the present disclosure also disclose some application scenarios that the low voltage detection logic circuit 11 receives the request for reading the data from the NVM 10, i.e., application scenarios that the low voltage detection logic circuit 11 is triggered to detect the power supply voltage of the NVM 10. For example, the following conditions may be included.

At one, in a chip starting process, under the condition that a circuit system in the chip may read system configuration information from the NVM 10 to complete system configuration, the low voltage detection logic circuit 11 may be triggered to detect the power supply voltage of the NVM 10.

At two, after the chip is started, when the circuit system may trigger the NVM controller 12 to read sensitive information from the NVM 10 according to an application requirement, the low voltage detection logic circuit 11 may be triggered to detect the power supply voltage of the NVM 10.

At three, when the chip includes an encryption and decryption component and all keys are stored in the NVM 10, under the condition that a key may be read from the NVM 10, the low voltage detection logic circuit 11 may be triggered to detect the power supply voltage of the NVM 10.

After the low voltage detection logic circuit is triggered under the three conditions, the circuit system enters a ready state for reading the system configuration information, the key or other sensitive information from the NVM at first. Then, the low voltage detection logic circuit reads the pre-burnt region return value from the pre-burnt region and determines whether the pre-burnt region return value is equal to the target pre-burnt value or not. When the pre-burnt region return value is equal to the target pre-burnt value, the first control signal is generated, and the first control signal is sent to the NVM controller to control the NVM controller to read the system configuration information, the key or the other sensitive information from the NVM. When the pre-burnt region return value is unequal to the target pre-burnt value, the second control signal and the third control signal are generated, the second control signal is sent to the chip protection component to control the chip protection component to trigger the chip to enter the self-protection mode, and the third control signal is sent to the NVM controller to prohibit the NVM controller from reading the system configuration information, key or other sensitive information from the NVM.

Figure 8:
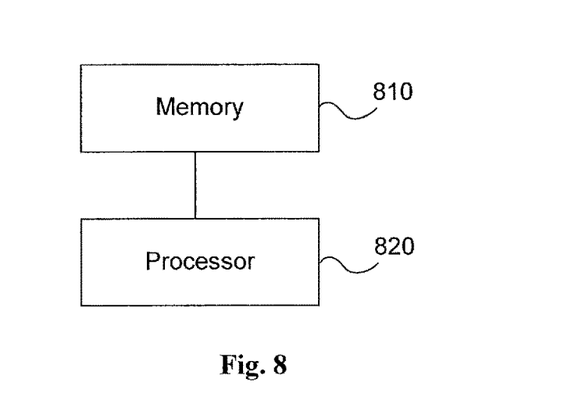
FIG. 8 is a structural schematic diagram of a low voltage detection logic circuit according to another embodiment of the present disclosure.

FIG. 8 is a structural schematic diagram of a low voltage detection logic circuit according to another embodiment of the present disclosure. The low voltage detection logic circuit includes a memory 810 and a processor 820.

The memory 810 may be a magnetic disk, a flash memory or any other nonvolatile storage medium. The memory is configured to store instructions in the embodiment corresponding to at least one of FIG. 1, FIG. 3 and FIG. 4.

The processor 820 is coupled with the memory 810. For example, the processor may be a microprocessor or a microcontroller. The processor 820 is configured to execute the instructions stored in the memory to determine whether a pre-burnt region return value is equal to a target pre-burnt value or not and, when the pre-burnt region return value is equal to the target pre-burnt value, control an NVM controller to read data from an NVM, thereby solving the problem of data reading instability caused by an abnormal state of a power supply voltage of the NVM as much as possible.

Figure 9:
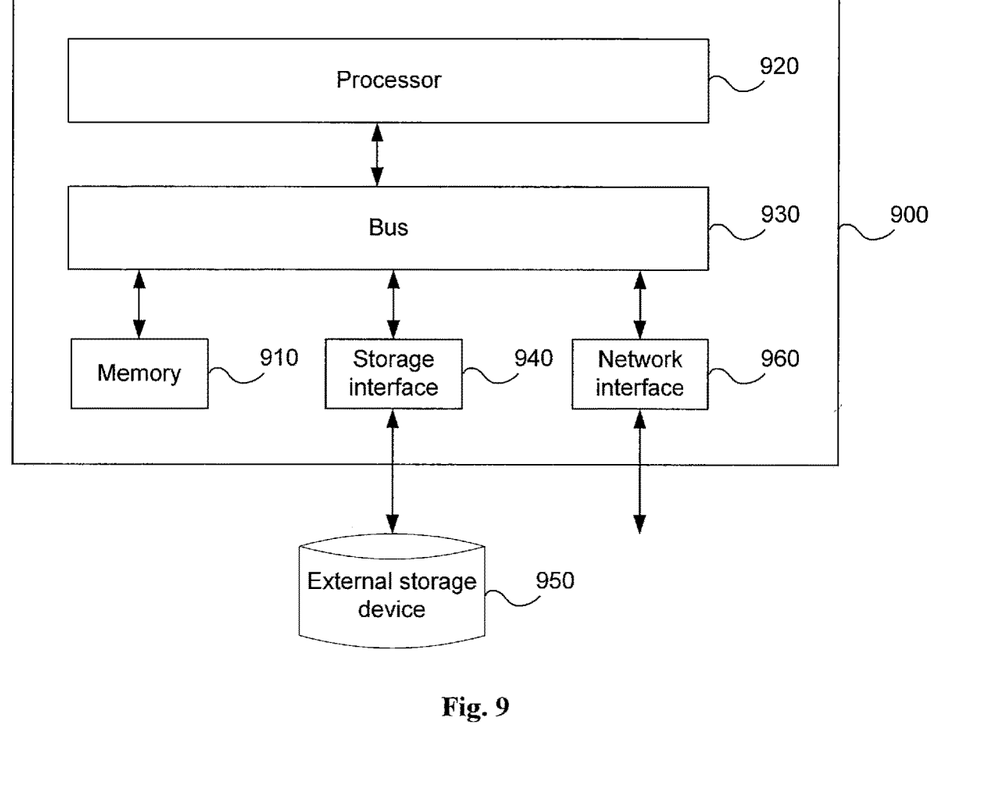
FIG. 9 is a structural schematic diagram of a low voltage detection logic circuit according to another embodiment of the present disclosure.

In some embodiments, as shown in FIG. 9, the low voltage detection logic circuit 900 may further include a memory 910 and a processor 920. The processor 920 is coupled with the memory 910 through a bus 930. The low voltage detection logic circuit 900 may further be connected with an external storage device 950 through a storage interface 940 to call external data, and may further be connected with a network or another computer system (not shown) through a network interface 960. Detailed introductions are omitted herein.

In the embodiment, at least one data instruction is stored through the memory, and the processor processes the at least one data instruction to determine whether the pre-burnt region return value is equal to the target pre-burnt value or not. When the pre-burnt region return value is equal to the target pre-burnt value, the processor controls the NVM controller to read the data from the NVM, thereby solving the problem of data reading instability caused by the abnormal state of the power supply voltage of the NVM as much as possible.

In some other embodiments, the present disclosure also provides a computer-readable storage medium, in which at least one computer program instruction is stored, the at least one computer program instruction being executed by a processor to implement the steps of the method in the embodiment corresponding to at least one of FIG. 1, FIG. 3 and FIG. 4. Those skilled in the art should know that the embodiment of the present disclosure may be provided as a method, a device or a computer program product. Therefore, the embodiment of the present disclosure may adopt a form of pure hardware embodiment, pure software embodiment and combined software and hardware embodiment. Moreover, the embodiment of the present disclosure may adopt a form of computer program product implemented on one or more non-transitory computer-available storage media (including, but not limited to, a disk memory, a Compact Disc Read-Only Memory (CD-ROM), an optical memory and the like) including computer-available program codes.

The embodiment of the present disclosure is described with reference to flowcharts and/or block diagrams of the method, device (system) and computer program product according to the embodiment of the present disclosure. It should be understood that each flow and/or block in the flowcharts and/or the block diagrams and combinations of the flows and/or blocks in the flowcharts and/or the block diagrams may be implemented by computer program instructions. These computer program instructions may be provided for a universal computer, a dedicated computer, an embedded processor or a processor of another programmable data processing device to generate a machine, so that a device for realizing a function specified in one flow or more flows in the flowcharts and/or one block or more blocks in the block diagrams is generated by the instructions executed through the computer or the processor of the other programmable data processing device.

These computer program instructions may also be stored in a computer-readable memory capable of guiding the computer or the other programmable data processing device to work in a specific manner, so that a product including an instruction device may be generated by the instructions stored in the computer-readable memory, the instruction device realizing the function specified in one flow or many flows in the flowcharts and/or one block or many blocks in the block diagrams.

These computer program instructions may further be loaded onto the computer or the other programmable data processing device, so that a series of operating steps are executed on the computer or the other programmable data processing device to generate processing implemented by the computer, and steps for realizing the function specified in one flow or many flows in the flowcharts and/or one block or many blocks in the block diagrams are provided by the instructions executed on the computer or the other programmable data processing device.

It is finally to be noted that, in the present disclosure, relational terms such as first and second are adopted to distinguish one entity or operation from another entity or operation and do not always require or imply existence of such a practical relationship or sequence between the entities or operations. Moreover, terms "include", "contain" or any other variant thereof is intended to cover nonexclusive inclusions, so that a process, method, object or device including a series of elements not only includes those elements but also include other elements that are not listed clearly or further includes elements intrinsic to the process, the method, the object or the device. Under the condition of no more limits, an element limited by statement "including a/an" does not exclude existence of another element that is the same in a process, method, object or device including the element.

Each embodiment in the specification is progressively described, differences from the other embodiments are mainly described in each embodiment, and the same or similar parts in each embodiment may refer to those in the other embodiments.

The disclosed embodiments are described above to make the present disclosure implementable or available for those skilled in the art. Various modifications to these embodiments are apparent to those skilled in the art and the general principle defined in the specification may be implemented in the other embodiments without departing from the spirit or scope of the present disclosure. Therefore, the present disclosure is not limited to these embodiments illustrated in the specification but consistent with the widest scope consistent with the principle and novel characteristics disclosed in the specification.

What is claimed is:

1. A data reading method, comprising:
under the condition that a request for reading data from a NonVolatile Memory (NVM) is received, reading a pre-burnt region return value from a preset pre-burnt region of the NVM, the pre-burnt region being a storage space sensitive to a low power supply voltage in the NVM and the low power supply voltage being a voltage lower than a power supply voltage threshold value; and
under the condition that the pre-burnt region return value is equal to a target pre-burnt value, generating a first control signal, and sending the first control signal to an NVM controller, the first control signal being used for controlling the NVM controller to read the data from the NVM.

2. The data reading method as claimed in claim 1, further comprising:
under the condition that the pre-burnt region return value is unequal to the target pre-burnt value, generating a second control signal, and sending the second control signal to a chip protection component, the second control signal being used for controlling the chip protection component to trigger a chip to enter a self-protection mode.

3. The data reading method as claimed in claim 1, further comprising:

under the condition that the pre-burnt region return value is unequal to the target pre-burnt value, generating a third control signal, and sending the third control signal to the NVM controller, the third control signal being used for prohibiting the NVM controller from reading the data from the NVM.

4. The data reading method as claimed in claim 2, wherein controlling the chip protection component to trigger the chip to enter the self-protection mode comprises:
controlling the chip protection component to trigger a System on Chip (SoC) to be reset;
or,
under the condition that the SoC is not triggered to be reset, controlling the chip to enter a security mode.

5. The data reading method as claimed in claim 1, wherein the pre-burnt region is a storage space of which an offset relative to a power supply of the NVM exceeds a first offset.

6. The data reading method as claimed in claim 1, wherein the target pre-burnt value stored in the pre-burnt region is an inverse value of an initial value.

7. A low voltage detection logic circuit, comprising
a reading element, configured to, under the condition that that a request for reading data from a NonVolatile Memory (NVM) is received, read a pre-burnt region return value from a preset pre-burnt region of the NVM, the pre-burnt region being a storage space sensitive to a low power supply voltage in the NVM and the low power supply voltage being a voltage lower than a power supply voltage threshold value; and
a first control element, configured to, under the condition that the pre-burnt region return value is equal to a target pre-burnt value, generate a first control signal and send the first control signal to an NVM controller, the first control signal being used for controlling the NVM controller to read the data from the NVM.

8. The low voltage detection logic circuit as claimed in claim 7, further comprising:
a second control element, configured to, under the condition that the pre-burnt region return value is unequal to the target pre-burnt value, generate a second control signal and send the second control signal to a chip protection component, the second control signal being used for controlling the chip protection component to trigger a chip to enter a self-protection mode.

9. The low voltage detection logic circuit as claimed in claim 7, further comprising:
a third control element, configured to, under the condition that the pre-burnt region return value is unequal to the target pre-burnt value, generate a third control signal and send the third control signal to the NVM controller, the third control signal being used for prohibiting the NVM controller from reading the data from the NVM.

10. The low voltage detection logic circuit as claimed in claim 7, wherein
the pre-burnt region is a storage space of which an offset relative to a power supply of the NVM exceeds a first offset.

11. The low voltage detection logic circuit as claimed in claim 7, wherein
the target pre-burnt value stored in the pre-burnt region is an inverse value of an initial value.

12. An integrated circuit, comprising:
the low voltage detection logic circuit as claimed in claim 7; and
a NonVolatile Memory (NVM) controller, connected with the low voltage detection logic circuit and configured to, under the condition that a first control signal is received from the low voltage detection logic circuit, read data from an NVM.

13. The integrated circuit as claimed in claim 12, further comprising:
a chip protection component, connected with the low voltage detection logic circuit and configured to, under the condition that a second control signal is received from the low voltage detection logic circuit, trigger a chip to enter a self-protection mode.

14. The integrated circuit as claimed in claim 12, wherein the NVM controller is further configured to, under the condition that a third control signal is received from the low voltage detection logic circuit, be prohibited from reading the data from the NVM.

15. A chip, comprising:
the integrated circuit as claimed in claim 12.

16. The chip as claimed in claim 15, further comprising:
a NonVolatile Memory (NVM) connected with the integrated circuit, wherein the NVM is preset with a pre-burnt region sensitive to a low power supply voltage, and a target pre-burnt value is pre-burnt in the pre-burnt region.

17. A low voltage detection logic circuit, comprising:
a memory; and
a processor coupled with the memory, the processor being configured to execute the method as claimed in claim 1 based on at least one instruction stored in the memory.

18. A computer-readable storage medium, in which at least one computer program instruction is stored, the at least one computer program instruction being executed by a processor to implement the steps of the method as claimed in claim 1.

* * * * *